(12) United States Patent
Matsunuma (10) Patent No.: US 6,482,554 B2
(45) Date of Patent: Nov. 19, 2002

(54) METHOD FOR MANUFACTURING A SEMICONDUCTOR DEVICE, PHOTOLITHOGRAPHY MASK AND METHOD FOR MANUFACTURING THE SAME

(75) Inventor: Takeshi Matsunuma, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 134 days.

(21) Appl. No.: 09/730,604

(22) Filed: Dec. 7, 2000

(65) Prior Publication Data

US 2001/0053486 A1 Dec. 20, 2001

(30) Foreign Application Priority Data

Jun. 7, 2000 (JP) ........................................ 2000-171330

(51) Int. Cl.[7] .............................. G03F 9/00; G03C 5/00
(52) U.S. Cl. ........................... 430/5; 430/313; 430/394
(58) Field of Search ............................. 430/5, 311, 312, 430/313, 394, 795, 796

(56) References Cited

U.S. PATENT DOCUMENTS 5,753,417 A * 5/1998 Ulrich ......................... 430/312
5,906,910 A * 5/1999 Nguyen et al. .............. 430/311
6,355,399 B1 * 3/2002 Sajan et al. .................. 430/311

FOREIGN PATENT DOCUMENTS

| JP | 9-246375 | 9/1997 |
| JP | 11-224898 | 8/1999 |
| JP | 11-289010 | 10/1999 |

\* cited by examiner

Primary Examiner—S. Rosasco
(74) Attorney, Agent, or Firm—McDermott, Will & Emery (57) ABSTRACT

A first photoresist film 36 with low sensitivity and a second photoresist film 38 with high sensitivity are stacked on an interlayer insulating film 14 formed on a semiconductor substrate (FIGS. 1A to 1C). The first and second photoresist films 36 and 38 are exposed simultaneously using a photolithography mask 40 having a first transmittance part 48 corresponding to the contact hole and a second transmittance part 50 corresponding to the upper wiring (FIG. 1D). They are developed so that the difference in depth between the contact hole and the upper wiring is three-dimensionally reflected in the first and second photoresist films 36 and 38 (FIG. 1E). Etching is carried out by using them as a mask to form the contact hole and the upper wiring.

9 Claims, 11 Drawing Sheets

METHOD FOR MANUFACTURING A SEMICONDUCTOR DEVICE, PHOTOLITHOGRAPHY MASK AND METHOD FOR MANUFACTURING THE SAME

BACKGROUND OF THE INVENTION

1. Field of the Invention

The present invention relates to a method for manufacturing a semiconductor device. The present invention relates also to a photolithography mask and a method for manufacturing the same. The methods and mask according to the present invention are suitable for efficient production of a plurality of wiring elements differing in depth.

2. Description of the Background Art

A semiconductor element contains a plurality of wiring elements, such as contact plug and interconnections, which vary in depth and pattern. According to the conventional method, they are formed individually by means of photolithography masks for respective patterns.

Figure 10A:
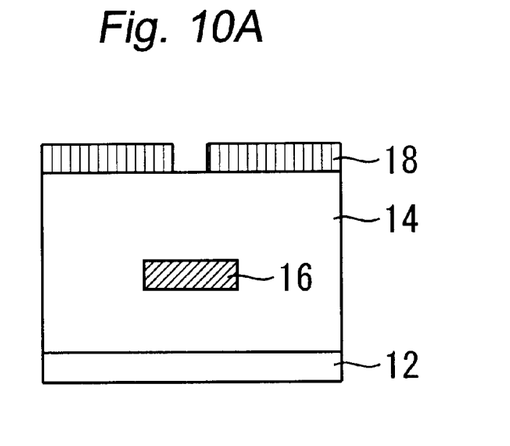
FIGS. 10A through 10E are diagrams for describing a manufacturing method of a conventional semiconductor.

FIGS. 10A through 10E are sectional views for describing the steps of such conventional manufacturing method. There are shown a semiconductor substrate 12, an interlayer insulating film 14, and a lower layer wiring 16. According to the conventional method, the interlayer insulating film 14 is formed on the lower layer wiring 16 before a first photoresist film 18 is formed on the later, as shown in FIG. 10A. The first photoresist film 18 is patterned by means of a first mask 20 as shown in FIG. 11A so as to be used to form a contact hole in the interlayer insulating film 14. In FIG. 11A, those parts indicated by reference numerals 22 are etching object parts, i.e., the parts corresponding to contact holes.

Figure 10B:
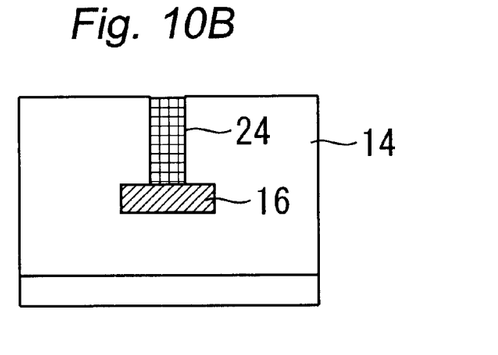
Figure 11A:
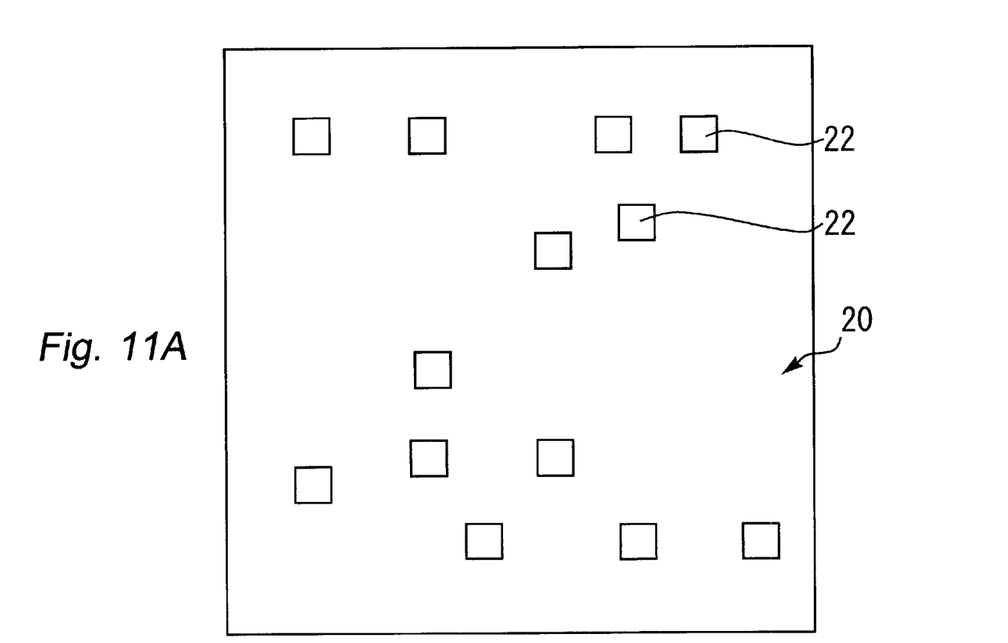
FIGS. 11A and 11B are plan views of photolithography masks used to produce the conventional semiconductor device.

Etching through the first photoresist film 18 as a mask forms a contact hole communicating with the lower layer wiring 16, as shown in FIG. 10B. The contact hole is filled with metal so that the contact plug 24 is formed.

Figure 10C:
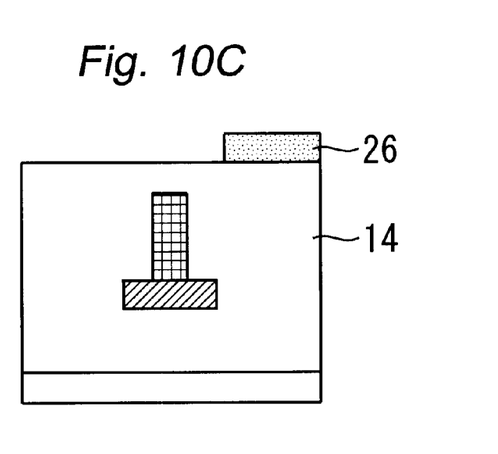
Figure 11B:
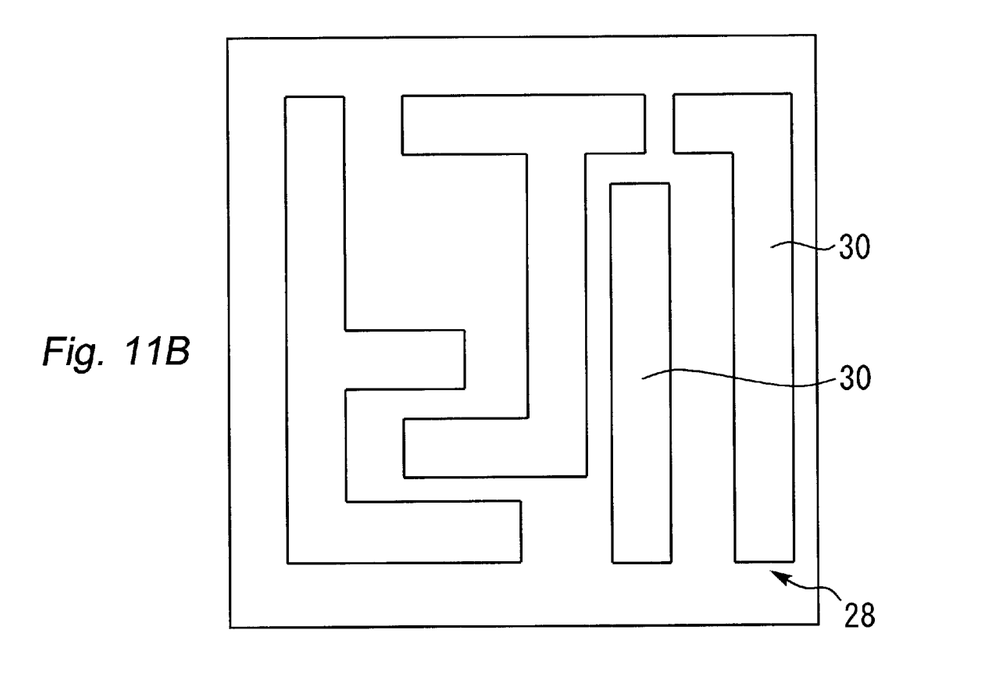

As shown in FIG. 10C, the contact plug 24 is covered with an interlayer insulating film 14, which is subsequently covered with a second photoresist film 26. The second photoresist film 26 is patterned by means of a second mask 28 as shown in FIG. 11B so as to be used to form trenches for upper layer wiring on the interlayer insulating film 14. In FIG. 11B, those parts indicated by reference numerals 30 are etching object parts, i.e., the parts corresponding to the trenches for upper layer wiring.

Figure 10D:
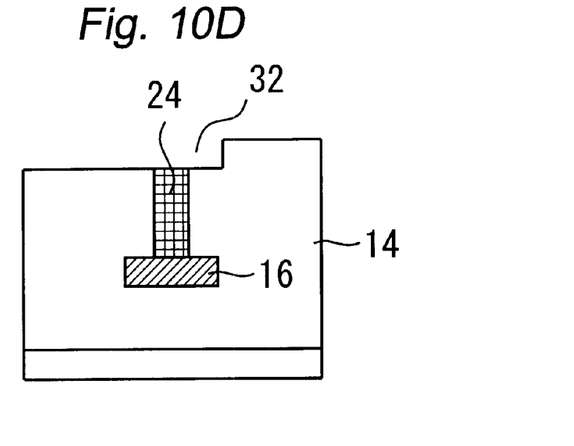
Figure 10E:
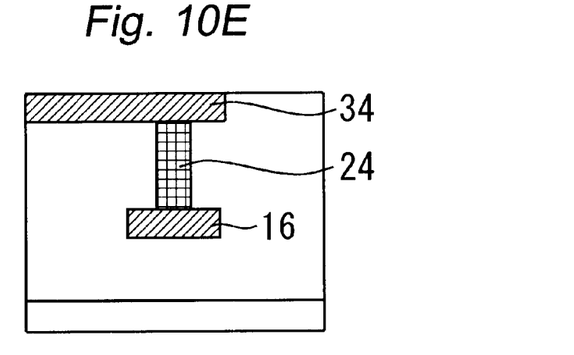

Etching through the second photoresist film 26 as a mask forms trenches 30 for upper layer wiring in the layer on the contact plug 24, as shown in FIG. 10D. The trenches 30 are filled with metal so that the upper layer wiring 34 communicating with the contact plug 24 is formed, as shown in FIG. 10E.

As mentioned above, the conventional method is designed to form sequentially the contact plug and the upper layer wiring 34, which differ in depth and pattern, by using separate photolithography masks. Therefore, the conventional method needs many steps to form these wiring elements.

In addition, the conventional method is designed to perform separately photolithography for the contact plug 24 and photolithography for the upper layer wiring 34. The result is incomplete alignment with each other, which leads to electrical troubles (such as short-circuits, openings, and variation in resistance) in semiconductor devices.

SUMMARY OF THE INVENTION

The present invention has been conceived to solve the previously mentioned problems. It is a first object of the present invention to provide a method for manufacturing semiconductor devices capable of accurately forming in a simple manner a plurality of wiring elements differing in depth and pattern.

It is a second object of the present invention to provide a photolithography mask useful for accurately forming in a simple manner a plurality of wiring elements differing in depth and pattern.

It is a third object of the present invention to provide a method for producing such a photolithography mask.

The above objects of the present invention are achieved by a method for manufacturing a semiconductor device having a plurality of wiring elements differing in depth and pattern. In the method, a plurality of photoresist films differing in sensitivity are stacked on a prescribed film formed on a semiconductor substrate. The plurality of photoresist films are exposed in such a way that the respective parts where the plurality of wiring elements are formed are irradiated with exposure light with an intensity corresponding to the depth of the individual wiring element. The plurality of photo resist films are developed so as to pattern the individual photoresist films into a desired shape. The prescribed film is etched by using the plurality of photoresist films, which have been patterned, as a mask, thereby forming a space to accommodate the plurality of wiring elements. A metal material is embedded in the space so as to form the plurality of wiring elements.

The above objects of the present invention are also achieved by a photolithography mask used to form n kinds (n is an integer of 3 or above) of wiring elements differing in depth and pattern. The photolithography mask includes a substrate which transmits the exposure light. The photolithography mask also includes n layers of light-shielding films which are stacked on the substrate. Each of the n layers of light-shielding films has a high resistance to etching to remove the light-shielding film placed thereon and also is patterned to a desired shape.

The above objects of the present invention are achieved by a method for manufacturing a photolithography mask used to form n kinds (n is an integer of 3 or above) of wiring elements differing in depth and pattern. In the method, n layers of light-shielding films are stacking sequentially from the first layer to the nth layer on a substrate which transmits the exposure light. The n layers of light-shielding films are etched sequentially starting from the nth layer in such a way that the with layer (i is an integer of 1 to n) of light-shielding film assumes a shape corresponding to all of the i kinds of the wiring elements selected from the deeper side. Each of the nth layer of light-shielding film having a high resistance to etching to remove the light-shielding film placed thereon.

Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings. The members and steps that are common to some of the drawings are given the same reference numerals and redundant descriptions therefor may be omitted.

First Embodiment

FIGS. 1A through 1E and FIGS. 2A through 2E are sectional views for describing a manufacturing method according to a first embodiment of the present invention, which show a wiring part of ASIC or DRAM. In those figures, reference numerals 12, 14 and 16 are designated to a semiconductor substrate 12, an interlayer insulating film 14, and a lower layer wiring 16, respectively.

Figure 1A:
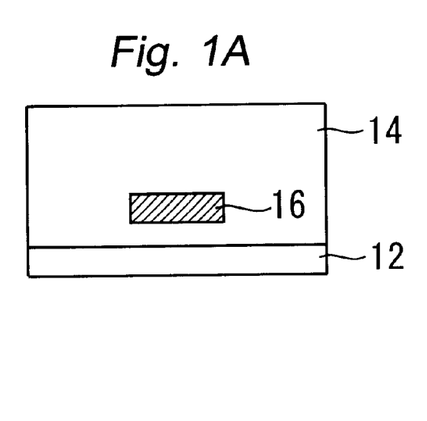
FIGS. 1A through 1E and FIGS. 2A through 2E are diagrams for describing a manufacturing method according to a first embodiment of the present invention.

As shown in FIG. 1A, on the lower layer wiring 16 is formed the interlayer insulating film 14 in this embodiment.

Figure 1B:
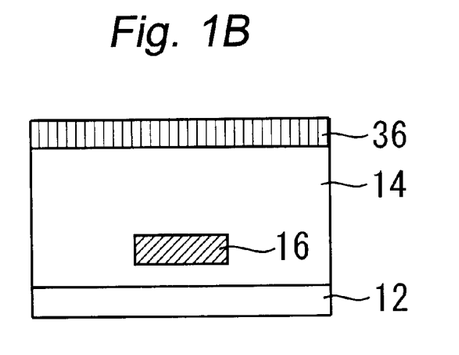

As shown in FIG. 1B, the interlayer insulating film 14 is coated with a first photoresist film 36 of comparatively low sensitivity. In this embodiment, a chemically amplified resist composed of a partly protected polyhydroxystyrene or the like added with 3% onium salt serving as a photosensitive material is coated as the first photoresist film with a thickness ranging between 350 to 450 nm.

Figure 1C:
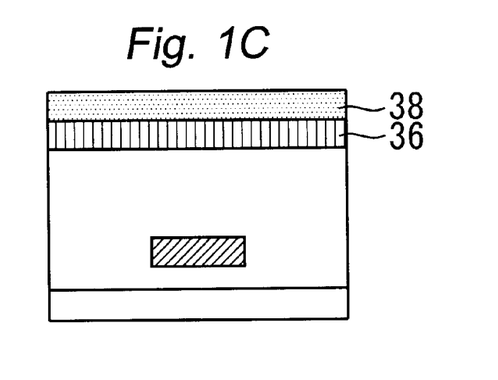

Then, as shown in FIG. 1C, the first photoresist film 36 is coated with a second photoresist film 38 of comparatively high sensitivity. In this embodiment, a chemically amplified resist composed of a partly protected polyhydroxystyrene or the like added with 20% onium salt serving as a photosensitive material is coated as the second photoresist film with a thickness ranging between 700 to 800 nm.

In this embodiment, the first photoresist film 36 and the second photoresist film 38 differ in sensitivity because of their different content of photo sensitive material. Making difference the materials of the first photoresist film 36 and the second photoresist film 38 may also ensure difference between sensitivities thereof. In this embodiment, the first photoresist film 36 is directly coated with the second photoresist film 38; however, it is also possible to form a film of water-soluble resin between them if they are miscible at their boundary.

Figure 1D:
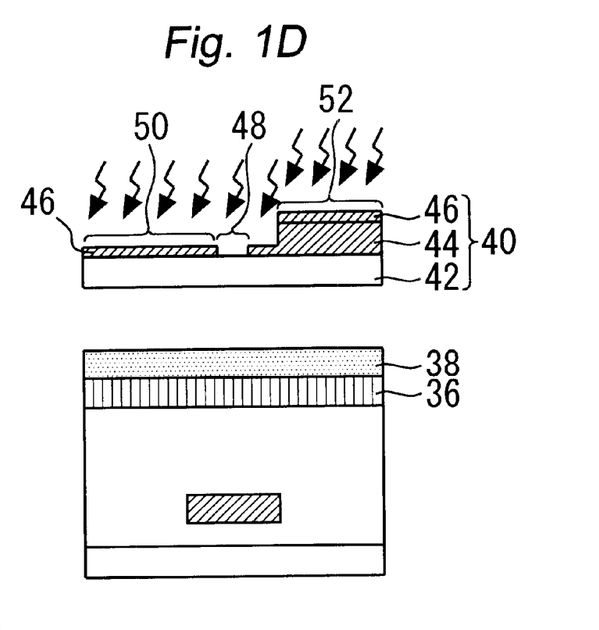

Then, as shown in FIG. 1D, an exposure process of the first and second photoresist films 36 and 38 are performed through use of a photolithography mask 40. The exposure process is performed under a condition in which the wavelength of exposure light is 248 nm and the energy of exposure is 60 mJ/sec in this embodiment.

Figure 3:
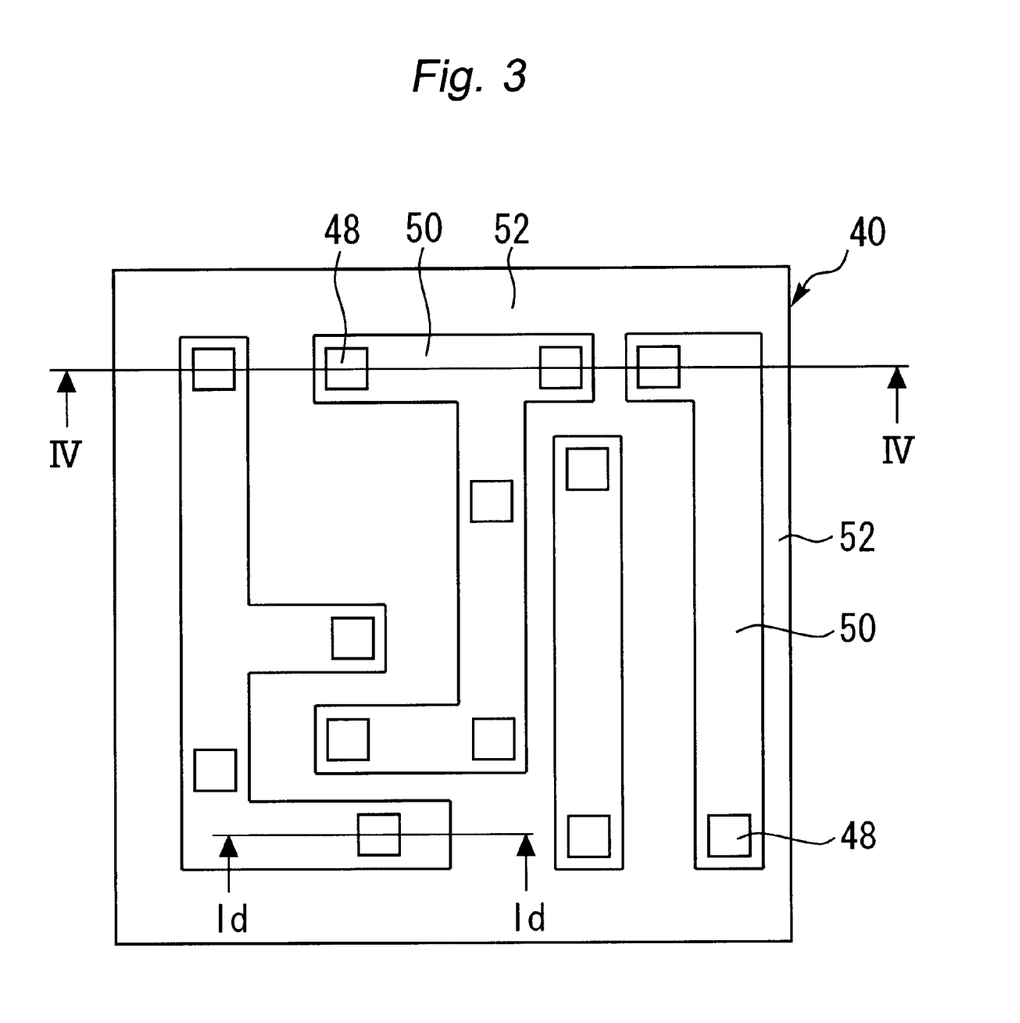
FIG. 3 is a plan view of a photolithography mask used in the first embodiment of the present invention.

FIG. 3 is a plan view of the photolithography mask 40 used in this embodiment. The sectional view shown in FIG. 1D of the photolithography mask 40 accords with a view taken along the line Id—Id in FIG. 3.

As shown in FIG. 1D, the photolithography mask 40 is composed of a substrate 42 of $SiO_2$ or the like, a first light-shielding films 44 and a second light-shielding films 46 formed on the substrate 42. As shown in FIG. 3, the photolithography mask 40 includes three parts: a first transmittance part 48 corresponding to patterns of contact plugs; a second transmittance part 50 corresponding to patterns of wiring; and a light-shielding part 52 which is excluded from those parts 48 and 50. The first transmittance part 48 corresponds to that part of the substrate 42, which is covered by neither the first light-shielding part 44 nor the second light-shielding part 46. The second light-shielding part 52 corresponds to that part which is covered only by the second light-shielding part 46. The light-shielding part 52 corresponds to that part which is covered by both the first light-shielding part 44 and the second light-screening part 46. The method manufacturing the photolithography mask 40 will be explained later in detail.

As a result of exposure through the photolithography mask 40, the region covered by the first transmittance part 48 is exposed with a first intensity and the region covered by the second transmittance part 50 is exposed with a second intensity which is smaller than the first intensity. The exposure light does not reach the region covered by the light-shielding part 52. In this embodiment, the sensitivity of the first and second photoresist films 36 and 38 and the transmittance of the first and second transmittance parts 48 and 50 are adjusted such that both the first and second photo resist films 36 and 38 are sensitized in the region covered by the first transmittance part 48 and the second photoresist film 38 alone is sensitized in the region covered by the second transmittance part 50.

Figure 1E:
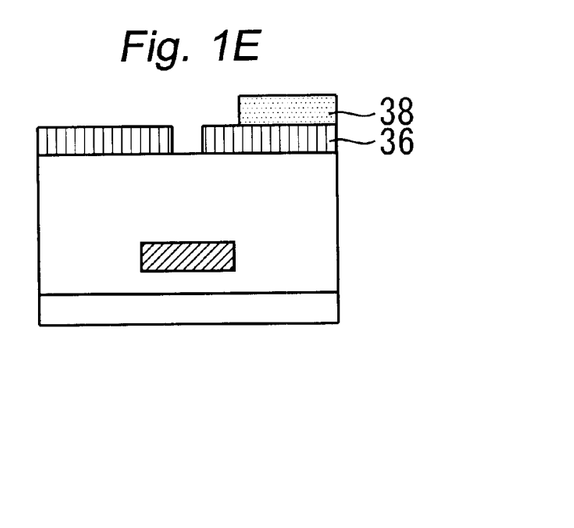

Thus, the exposure process through use of the photolithography mask 40 followed by a development process causes the first photoresist film 36 to be patterned in conformity with the contact plug and the second photoresist film 38 to be patterned in conformity with the wiring, as shown in FIG. 1E. As mentioned above, the method according to this embodiment permits two kinds of photoresist films to be patterned differently by only one exposure step.

Figure 2A:
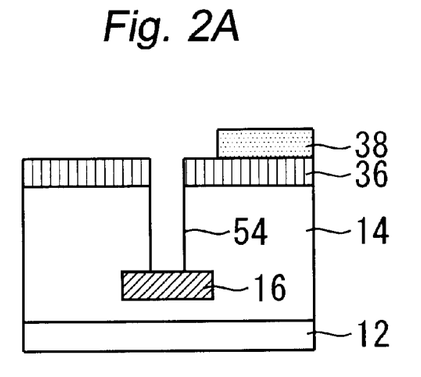

Then, as shown in FIG. 2A, the interlayer insulating film 14 is etched while using the first photoresist film 36 and the second photoresist film 38 as a mask. This etching is performed such that the interlayer insulating film 14 is solely etched while the first photoresist film 36 and the second photoresist film 38 remain unetched. To be more specific, this etching is carried out using a magnetic RIE apparatus under the following condition; i.e., Pressure of 50 mT, Energy of 1500 W. and Gas flow rate of $C_4F_8/CH_2F_2/Ar=$ 5/4/500 sccm. This treatment forms the contact hole 54 communicating with the lower-layer wiring 16.

Figure 2B:
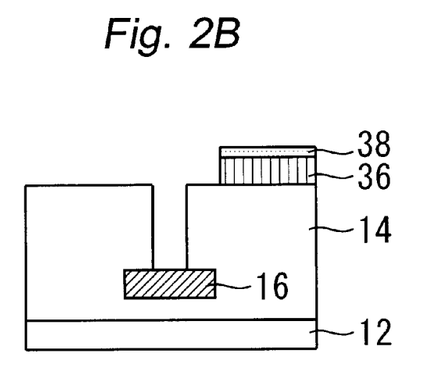

Subsequently, etching is carried out so as to remove the first photoresist film 36. To be more specific, etching is carried out using a magnetic RIE apparatus under the following condition; i.e., Pressure of 40 mT, Energy of 600 W, and Gas flow rate of $CF_4/Ar/O_2=40/200/10$ sccm. As a result, as shown in FIG. 2B, the first photoresist film 36 is patterned in conformity with the wiring pattern (i.e., the pattern of the second photoresist film 38). During this etching, the second photoresist film 38 decreases in thickness. In this embodiment, the coating thickness of the first photoresist film 36 is ensured between 350 to 450 nm, whereas the coating thickness of the second photoresist film 38 is ensured between 700 to 800 nm. Therefore, it is possible to accurately pattern the first photoresist film 36 in conformity with the wiring pattern while leaving the second photoresist film 38 on the first photoresist film 36 with a sufficient thickness.

Figure 2C:
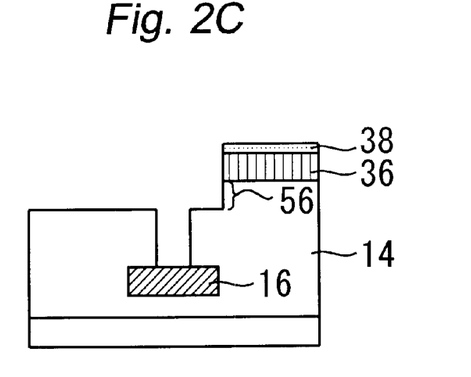

Then, with the first photoresist film 36 and the second photoresist film 38 used as a mask, etching is carried out, as shown in FIG. 2C, by using a magnetic RIE apparatus under the following condition suitable for removable of the interlayer insulating film 14; i.e., Pressure of 40 mT, Energy of 1700 W, Gas flow rate of $C_4F_8/CO/O_2/Ar=8/50/5/250$ sccm. As a result, the trench 56 for the upper wiring is formed in the interlayer insulating film 14. In this embodiment, the etching treatment explained with reference to FIGS. 2A to 2C may be carried out continuously without the semiconductor wafer being taken out from an etching chamber.

Figure 2D:
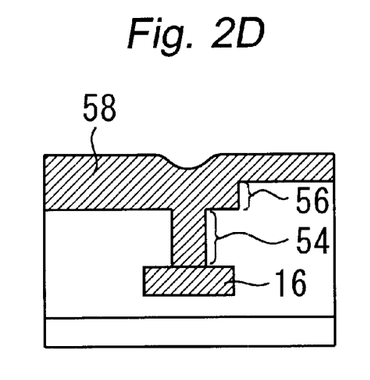

As shown in FIG. 2D, after the trench 56 has been removed, the first photoresist film 36 and the second photoresist film 38 (remaining on the interlayer insulating film 14) are removed. Then, a metal material 58 is deposited over the entire surface of the semiconductor wafer such that the contact hole 54 and the trench 56 are filled.

Figure 2E:
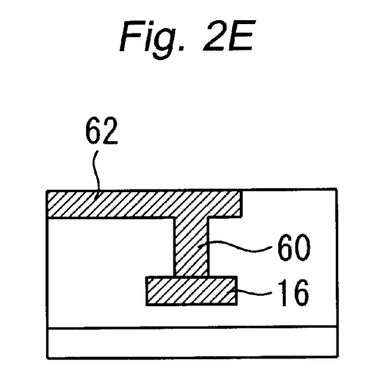

As shown in FIG. 2E, an unnecessary part of the metal material deposited on the interlayer insulating film 14 is removed by CMP. As a result, the contact plug 60 and the upper layer wiring 62 are integrally formed in the contact hole 54 and the trench 56.

As mentioned above, according to this embodiment, the first photoresist film 36 and the second photoresist film 38 are exposed simultaneously by a single step of exposure. Thus, no misalignment occurs between the pattern of the first photoresist film 36 and the pattern of the second photoresist film 38 in this embodiment. Therefore, the method according to this embodiment certainly prevents misalignment between the contact plug 60 and the upper wiring 58.

As described previously, the method according to this embodiment permits the contact plug 60 and the upper layer wire 62 to be formed integrally without misalignment. The contact plug 60 and the upper layer wiring 62 prevent electrical short-circuits, opening, and variation of resistance from a rising. Thus, according to this embodiment, it is possible to produce a semiconductor device with stable characteristic properties in a simple manner.

As mentioned above, the state shown in FIG. 1E is formed by stacking two kinds of photoresist and exposing the photoresist films simultaneously. However, it is not always necessary to use, two kinds of photoresist to form the state shown in FIG. 1E by a single exposure. In other words, the state similar to that shown in FIG. 1E may be obtained by exposing a thick, single-layer photoresist through a photolithography mask 40.

In the case where a single-layer photoresist is employed, the film thickness of exposed photoresist is apt to be affected with varies of exposure amount or varies of transmittance of the mask. Thus, in the case of a single-layer photoresist, it is difficult to make uniform in thickness the resist layer for the contact plug (the layer corresponding to the first photoresist film 36) and the resist layer for the wiring (the layer corresponding to the second photoresist film 38).

The method according to this embodiment includes the step of etching the first photoresist film 36 using the second photoresist film 38 as a mask, as shown in FIGS. 2A and 2B. Film thicknesses of the first photoresist film 36 and the second photoresist film 38 must be accurately controlled before the step to render the same remain on the interlayer insulating film 14 in wiring form after the step. Therefore, in the case where a single-layer photoresist is used, it is not necessarily easy to remain the photoresist in the wiring form on the interlayer insulating film 14.

This is not the case with the method according to this embodiment, in which the first photoresist film 36 and the second photoresist film 38 differ in sensitivity and hence it is possible to accurately control their film thickness. Thus the method according to this embodiment is superior to the method that employs a single-layer photoresist for forming the upper layer wiring accurately.

In the method according to this embodiment, it is useful to impart different etching characteristics to the first photoresist film 36 and the second photoresist film 38 for rendering the photoresist film 36 and 38 remain on the interlayer insulating film 14 in wiring form. More particularly, it is useful to give the photoresist film 36 and 38 different characteristics so that the first photoresist film 36 is easily etched compared with the second photoresist film 38.

In the case of a single-layer photoresist, it is impossible that the upper layer and the lower layer of the same photoresist differ in etching selectivity. By contrast, according to this embodiment, it is possible to determine as desired the selectivity of the first photoresist film 36 and the second photoresist film 38. Therefore, the method according to this embodiment is superior in this respect to the method that employs a single-layer photoresist.

Explanation will be given here under with reference to FIGS. 4A through 4F of a method for manufacturing the photolithography mask 40 used in this embodiment.

FIGS. 4A through 4F are sectional views to illustrate the method for manufacturing the photolithography mask 40. These sectional views are taken along the line IV—IV in FIG. 3.

Figure 4A:
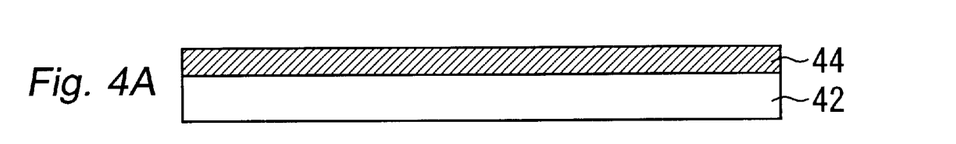
FIGS. 4A through 4F are diagrams for describing a manufacturing method of the photolithography mask shown in FIG. 3.

As shown in FIG. 4A, the method for manufacturing the photolithography mask 40 starts with forming the first light-shielding film 44 on the $SiO_2$ substrate 42. This light-shielding film 44 has a thickness large enough to completely screen the exposure light used for photolithography process. In this embodiment, the first light-shielding film 44 is a Cr film having a thickness of 80 nm.

Figure 4B:
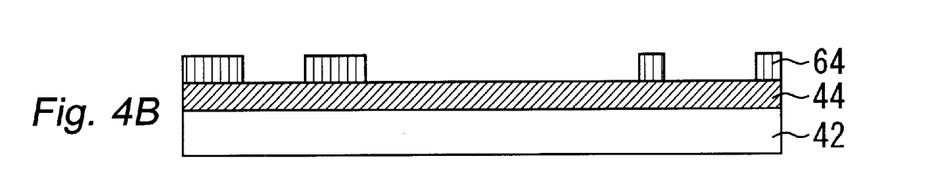

As shown in FIG. 4B, the first light-shielding film 44 is coated with a photoresist 64. The photoresist 64 is patterned by electron beams (EB) to a configuration surrounding the wiring, i.e., the configuration according with the light-shielding part 52 shown in FIG. 3.

Figure 4C:
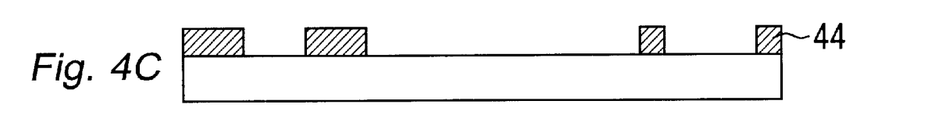

With the photoresist 64 used as a mask, etching is carried out, so that the first light-shielding film 44 is patterned into the form of the light-shielding part 52 as shown in FIG. 4C. After the patterning of the first light-shielding film 44, the photoresist 64 remaining thereon is removed.

Figure 4D:
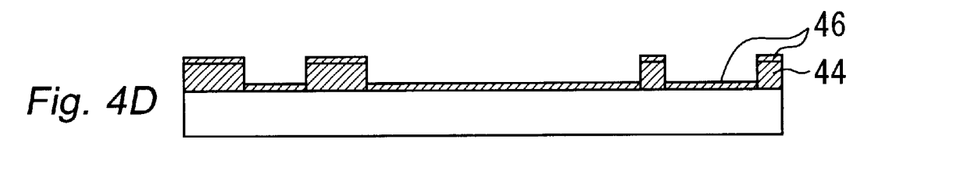

As shown in FIG. 4D, a second light-shielding film 46 is deposited on the entire surface of the substrate 42. The second light-shielding film 46 has a thickness which permits the exposure light to pass so that the second photoresist film 38 shown in FIG. 1D alone is sensitized (but the first photoresist film 36 is not sensitized). In this embodiment, the second light-shielding film 46 is a Cr film having a thickness of 100 nm. Incidentally, in this embodiment the first and second light-shielding films 44 and 46 are both Cr films; however, they may also be made of different materials.

Figure 4E:
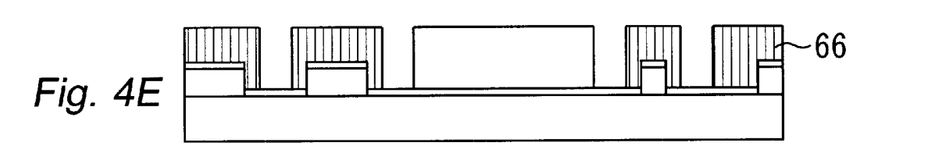

Then, the entire surface of the substrate 42 is coated with a photoresist 66. As shown in FIG. 4E, the photoresist 66 is patterned by electron beams (EB) to a configuration surrounding the contact plug, i.e., a configuration surrounding the first transmittance part 48 shown in FIG. 3.

Figure 4F:
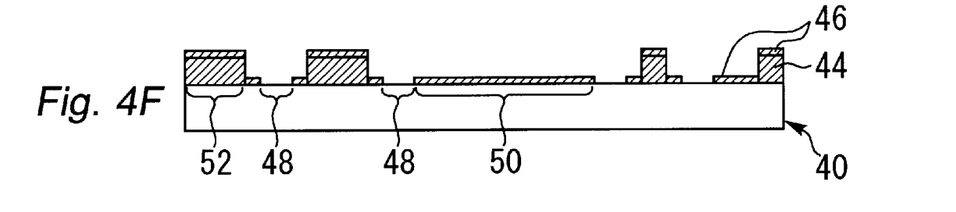

The etching with the photoresist 66 as a mask patterns the second light-shielding film 46 such that it surrounds the first transmittance part 48 as shown in FIG. 4F. After the second light-shielding film 46 has been patterned, the photoresist 66 remaining thereon is removed. Thus the photolithography mask is formed which consists of the first transmittance part 48, the second transmittance part 50, and the light-shielding part 52.

Second Embodiment

The second embodiment of the present invention will be explained with reference to FIGS. 5A through 5F.

FIGS. 5A through 5F are sectional views to illustrate a manufacturing method according to a second embodiment of the present invention. According to this embodiment, the first photoresist film 36 and the second photoresist film 38 are patterned simultaneously into a desired shape in the same way as that used in the first embodiment (see FIG. 5A).

Figure 5A:
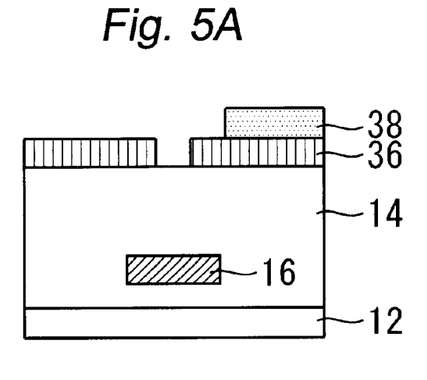
FIGS. 5A through 5F are diagrams for describing a manufacturing method according to a second embodiment of the present invention.
Figure 5B:
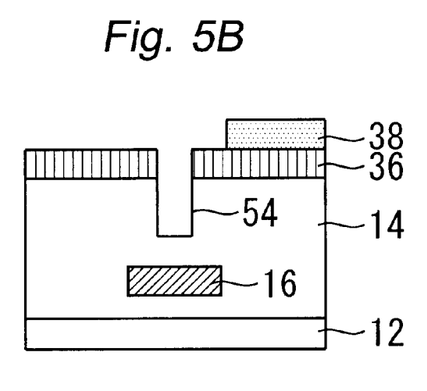

As shown in FIG. 5B, the interlayer insulating film 14 is subject to undergoes etched while using the first photoresist film 36 and the second photoresist film 38 as a mask. This etching is carried out such that the interlayer insulating film 14 alone is etched but the photoresist films 36 and 38 remain unetched. To be specific, this etching is carried out by using a magnetic RIE apparatus under the following condition; i.e., Pressure of 50 mT, Energy of 1300 W, and Gas flow rate of $C_4F_8/O_2/Ar=9/2/500$ sccm. In this embodiment, the above-mentioned etching is carried out to such an extent that the lower end of the contact hole 54 is a predetermined distance away from the lower wiring 16.

Figure 5C:
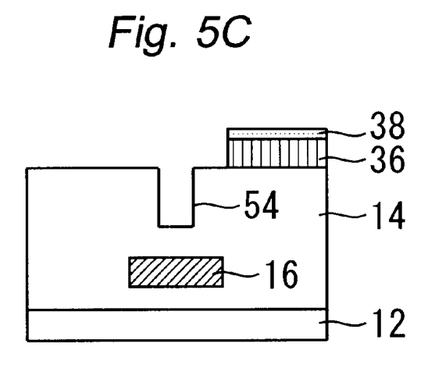

Then, etching is carried out to remove the first photoresist film 36. To be specific, this etching is carried out by using a magnetic RIE apparatus under the following condition; i.e., Pressure of 40 mT, Energy of 600 W, Gas flow rate of $CF_4/Ar/O_2=40/200/10$ sccm. As a result, the first photoresist film 36 is patterned into the wiring shape (i.e., the shape of the second photoresist film 38) as shown in FIG. 5C.

Figure 5D:
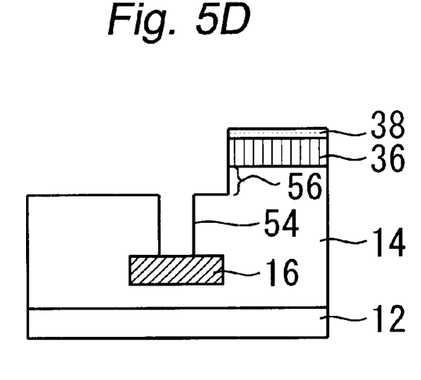

As shown in FIG. 5D, an etching process is performed through use of the first photoresist film 36 and the second photoresist film 38 as masks. The etching process is carried out under a condition suitable for removing the interlayer insulating film 14. More particularly, the etching is carried out using a magnetic RIE apparatus under a following condition; i.e., Pressure of 40 mT, Energy of 1700 W, and Gas flow rate of $C_4F_8/CO/O_2/Ar=8/50/5/250$ sccm. As a result, the trench 56 for the upper wiring is formed on the interlayer insulating film 14. In this embodiment, the contact hole 54 reaches the lower layer wiring 16 by being subjected to the etching process.

Figure 5E:
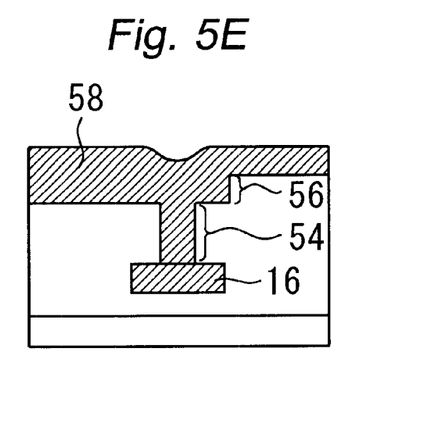
Figure 5F:
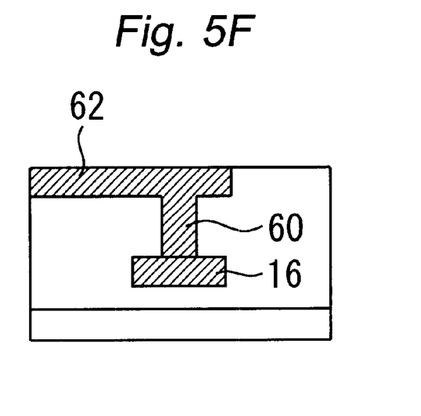

In the subsequent steps, the same procedure as in the first embodiment is carried out so as to form the contact plug 60 and the upper layer wiring 62 integrally inside the contact hole 54 and inside the trench 56 (see FIGS. 5E and 5F).

The method according to this embodiment produces the same effect as in the first embodiment and also reduces damage exerted on the lower layer wiring 54 during the formation of the contact hole 54 compared with the first embodiment. Therefore, the semiconductor device manufactured in this embodiment has stabler characteristics than that in the first embodiment.

Third Embodiment

The third embodiment of the present invention will be explained with reference to FIGS. 6A through 6F.

Figure 6A:
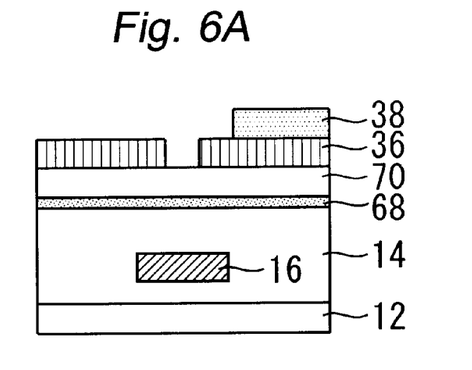
FIGS. 6A through 6F are diagrams for describing a manufacturing method according to a third embodiment of the present invention.

FIGS. 6A through 6F are sectional views to illustrate the method according to the third embodiment of the present invention. As shown in FIG. 6A, a stopper film 68 such as a silicon nitride (SiN) film is formed on the interlayer insulating film 14 in this embodiment. On the stopper film 68 is formed a second interlayer insulating film 70. The first photoresist film 36 and the second photoresist film 38 are patterned on the second interlayer insulating film 70 in the same way as in the first embodiment.

Figure 6B:
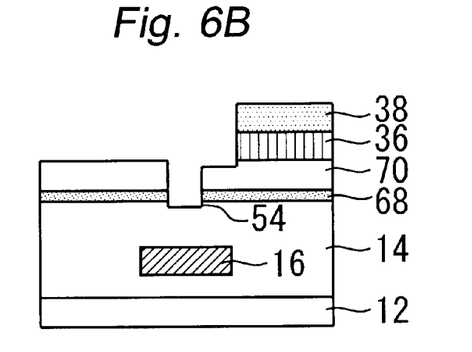

The second interlayer insulating film 70 and the stopper film 68 are etched while the first photoresist film 36 and the second photoresist film 38 are used as a mask. At least at the stage when the hall reaches the stopper film 68, the etching process is performed using a magnetic RIE apparatus under a condition suitable for removing the stopper film 68, more particularly, under the following condition; i.e., Pressure of 60 mT, Energy of 700 W, and Gas flow rate of $CH_2F_2/Ar= 50/100$ sccm. Incidentally, it is not necessarily required that the above-mentioned condition is designed so as not to remove the photoresist. As a result of this etching, a contact hole 54 penetrating the stopper film 70 is formed as shown in FIG. 6B.

Figure 6C:
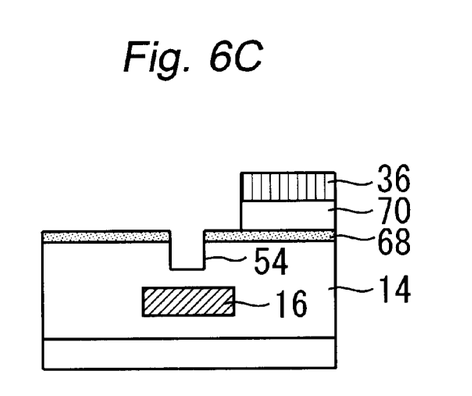

Then, etching condition is changed to one under which the stopper film 68 is not removed while the interlayer insulating film 14 and the second interlayer insulating film 70 are removed. To be specific, the condition of the etching process using a magnetic RIE apparatus is changed to the following condition; i.e., Pressure of 50 mT, Energy of 1500 W, and Gas flow rate of $C_4F_8/CH_2F_2/Ar=5/4/500$ sccm. As shown in FIG. 6C, the stopper film 68 serves as a stopper which prevents the etching from proceeding. As a result, in the layer of the second interlayer insulating film 70 is formed a trench 56 for the upper layer wiring with a uniform depth.

Figure 6D:
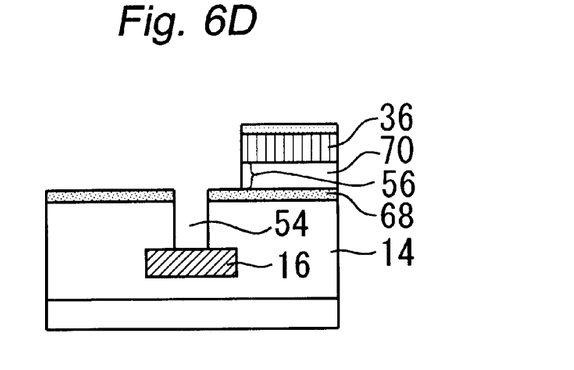

The above-mentioned etching is continued until the contact hole 54 reaches the lower layer wiring 16. As a result, the state shown in FIG. 6D is produced.

Figure 6E:
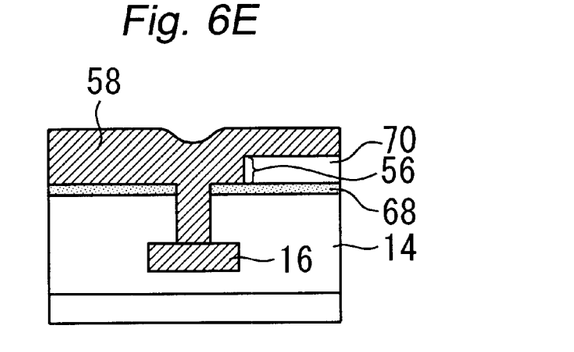
Figure 6F:
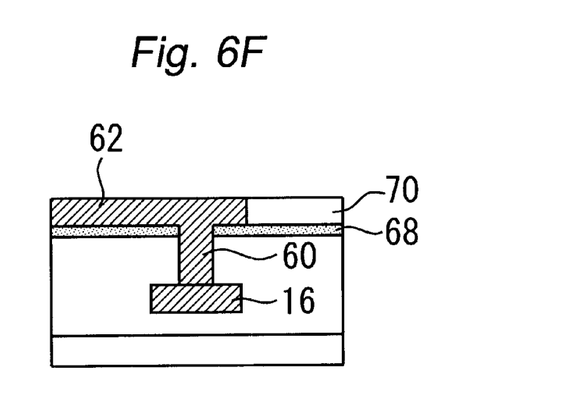

In the subsequent steps, the same procedure as in the first or second embodiment is carried out so as to form the contact plug 60 and the upper layer wiring 62 integrally inside the contact hole 54 and inside the trench 56 (see FIGS. 6E and 6F).

The method according to this embodiment produces the same effect as in the second embodiment and also makes uniform over the entire surface of the semiconductor wafer the thickness of the interlayer insulating film 14 placed between the upper layer wiring 62 and the lower wiring 16. Further, in this embodiment, both of the contact hall 54 and the trench 56 can be easily and precisely etched as long as the etching amount of the contact hall 54 is solely took into account. Thus, this embodiment simplifies the method for manufacturing a semiconductor device compared with the first or second embodiment.

Fourth Embodiment

The fourth embodiment of the present invention will be explained with reference to FIGS. 7A through 7H, FIG. 8 and FIGS. 9A through 9G. In the above-mentioned first to third embodiments, there are two kinds of wiring elements differing in depth and pattern. In this embodiment, description will be given of a case in which three kinds of wiring elements are formed. Although the three kinds of wiring elements may be produced by a method based on any of the above-mentioned first to third embodiments, a method based on the second embodiment is explained as a representative example thereof in this embodiment.

Figure 7A:
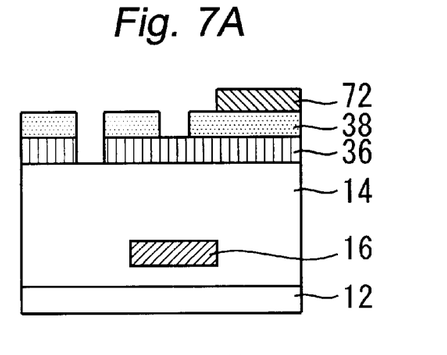
FIGS. 7A through 7H are diagrams for describing a manufacturing method according to a fourth embodiment of the present invention.

FIGS. 7A through 7H are sectional views for describing the manufacturing method according to the fourth embodiment of the present invention. As shown in FIG. 7A, a first photoresist film 36, a second photoresist film 38 and a third photoresist 72 are formed on the interlayer insulating film 14 in this embodiment. Of these three kinds of photoresist, the first photoresist film 36 has the lowest sensitivity and the third photoresist film 72 has the highest sensitivity.

Figure 8:
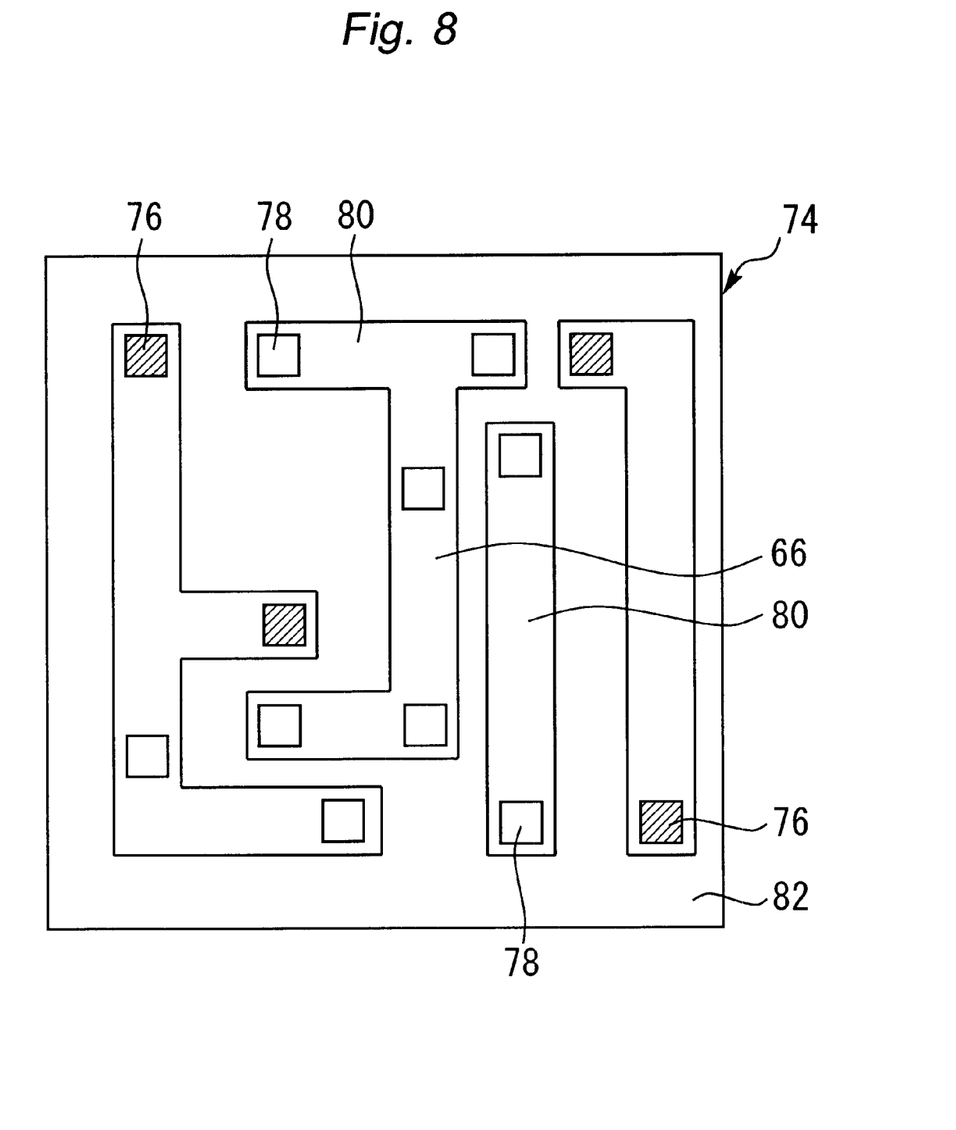
FIG. 8 is a plan view of a photolithography mask used in the fourth embodiment of the present invention.

The first photoresist film 36, the second photoresist film 38 and the third photoresist film 72 are exposed simultaneously through use of the photolithography mask 74 shown in FIG. 8. Likewise the mask shown in FIG. 3, the photolithography mask 74 is composed of an $SiO_2$ substrate and a plurality of light-shielding films each patterned to the desired shape. It is divided into four parts: a first transmittance part 76 corresponding to the pattern of the deep contact plug, a second transmittance part 78 corresponding to the pattern of the shallow contact plug, a third transmittance part 80 corresponding to the pattern of the wiring, and a light-shielding part 82 which does not belong to any of these three parts. Incidentally, the method for manufacturing the photolithography mask 40 will be explained later in detail.

Exposure through the photolithography mask 74 is carried out in the following way. The region covered by the first transmittance part 76 is exposed to light with the first intensity. The region covered by the second transmittance part 78 is exposed to light with the second intensity which is smaller than the first intensity. The region covered by the third transmittance part 80 is exposed to light with the third intensity which is smaller than the second intensity. The exposure light does not reach the region covered by the light-shielding part 82. In this embodiment, the sensitivity of the first to third photoresist film 38, 38 and 72 as well as the transmittance of the first to third transmittance parts 76, 78, and 80 are adjusted such that the above-mentioned exposure sensitizes all of the first to third photoresist film 36, 38 and 72 in the region covered by the first transmittance part 76, sensitizes the second and third photoresist film 38 and 72 in the region covered by the second transmittance part 78, and sensitizes the third photoresist film 72 alone in the region covered by the third transmittance part 80.

Therefore, the exposure through the photolithography mask 74 and the subsequent development result in patterning as shown in FIG. 7A. That is, the first photoresist film 36 is patterned in conformity with the shape of the deep contact plug. The second photoresist film 38 is patterned in conformity with the shape of the deep contact plug and the shallow contact plug. The third photoresist film 72 is patterned in conformity with the shape of the wiring. In this way, the method according to this embodiment permits three kinds of photoresist (differing in pattern) to be formed by a single exposure step.

Figure 7B:
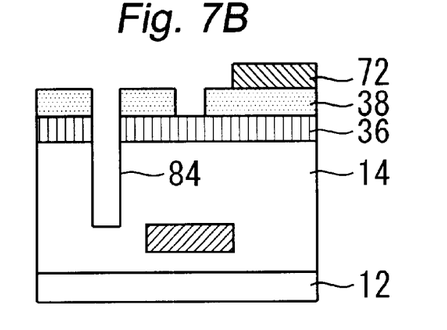

Then, as shown in FIG. 7B, the interlayer insulating film 14 is etched while using the first photoresist film 36, the second photoresist film 38 and the third photoresist film 72 as a mask. This etching is carried out such that the interlayer insulating film 14 is etched but the photoresist film 36, 38, and 72 remain unetched. To be specific, etching in this embodiment is carried out by using a magnetic RIE apparatus under the following condition; i.e., Pressure of 50 mT, Energy of 1300 W, and Gas flow rate of $C_4F_8/O_2/Ar=9/2/500$ sccm. This etching is continued until the bottom of the deep contact hole 84 reaches the position a prescribed distance away from the semiconductor substrate 12.

Figure 7C:
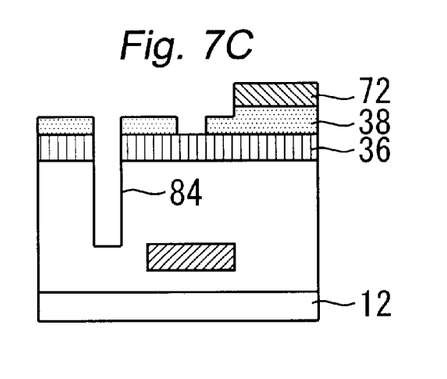

Then, etching is carried out under a condition capable of removal of the first photoresist film 36 (i.e., Pressure of 40 mT, Energy of 600 W and Gas flow rate of $CF_4/Ar/O_2=40/200/10$ sccm).

As a result, a pattern of the shallow contact hole is formed in the first photoresist film 36, as shown in FIG. 7C.

Figure 7D:
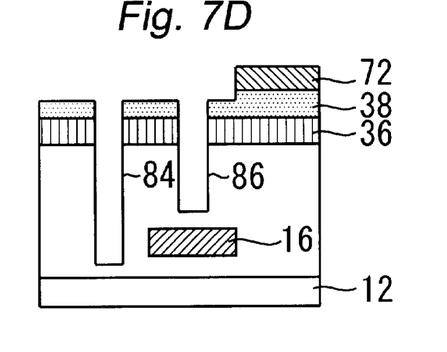

Etching is carried out again under a condition suitable for removing the interlayer insulating film 14 (i.e., Pressure of 40 mT, Energy of 600 W, Gas flow rate of $CF_4/Ar/O_2$ 40/200/8 sccm). As a result, the shallow contact hole 86 is formed as shown in FIG. 7D. This etching is continued until the bottom of the shallow contact hole 86 reaches the position a predetermined distance away from the lower layer wiring 16. Incidentally, it is not necessary that the shallow contact hole should be made under the same condition as for the deep contact hole.

Figure 7E:
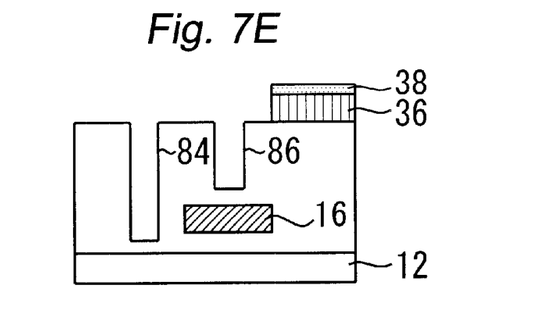

Then, etching is carried out under a condition capable of removal of the first photoresist film 36 and the second photoresist film 38 (i.e., Pressure of 40 mT, Energy of 700 W, and Gas flow rate of $CF_4/Ar/O_2$ 40/200/16 sccm). As a result, the first photoresist film 36 and the second photoresist film 38 are patterned into the shape of the wiring, as shown in FIG. 7E. Incidentally, this etching does not need to be carried out under the same condition as for etching to form the shape of the shallow contact hole in the first photoresist film 36.

Figure 7F:
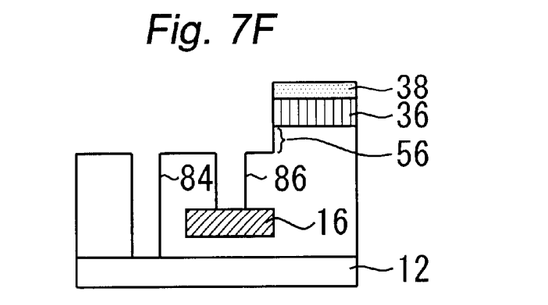

Etching is carried out again under a condition suitable for removing the interlayer insulating film 14 (i.e., Pressure of 40 mT, Energy of 1700 W, and Gas flow rate of $CF_4F_8/CO/O_2/Ar=5/50/5/250$ sccm). As a result, a trench 56 for the upper layer wiring is formed in the layer of the interlayer insulating film 14, as shown in FIG. 7F. In this embodiment, etching is carried out such that the bottom of the deep contact hole 84 reaches the semiconductor substrate 12 and the bottom of the shallow contact hole 86 reaches the lower layer wiring 16.

Figure 7G:
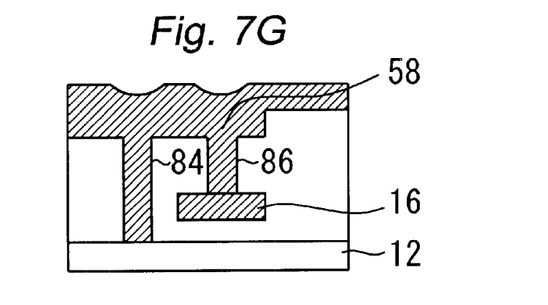
Figure 7H:
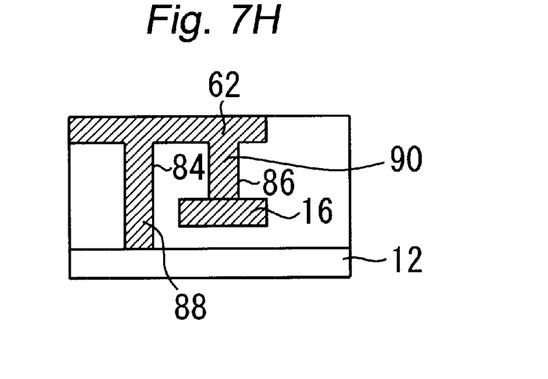

Subsequently, the same procedure as in the first to third embodiments is carried out so that the contact plugs 88 and 90 and the upper layer wiring 62 are formed integrally inside the deep contact hole 84, shallow contact hole 86 and the trench 56 for the upper layer wiring (See FIGS. 7G and 7H).

As mentioned above, the method according to this embodiment permits three kinds of wiring elements differing in depth and pattern to be formed integrally by a single exposure step.

Therefore, with the method according to this embodiment, it is possible to impart stable electrical properties to a semiconductor device having three kinds of wiring elements.

In the fourth embodiment mentioned above, three kinds of wiring elements are formed; however, the number of the kinds of the wiring elements is not limited to three. It is possible to form more than three wiring elements if more than three kinds of photoresist are stacked on the interlayer insulating film 14 and more than three different transmittance parts are formed on the photolithography mask.

Next, the method for manufacturing the photolithography mask 72 used in this embodiment is explained with reference to FIG. 9.

FIG. 9 is a sectional view to illustrate the method for manufacturing the photolithography mask 72. As shown in FIG. 9A, the method starts with coating the $SiO_2$ substrate 88 with a first light-shielding film 90, a second light-shielding film 92, and a third light-shielding film 94. The second light-shielding film 92 is formed from a material which is hardly removed when the third light-shielding film 94 undergoes etching.

Figure 9A:
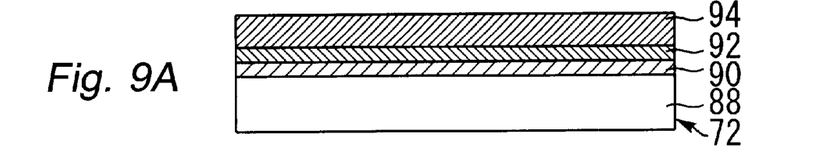
FIGS. 9A through 9G are diagrams for describing a manufacturing method of the photolithography mask shown in FIG. 8.

The first light-shielding film 90 is formed from a material which is hardly removed when the second light-shielding film 92 undergoes etching. In this embodiment, the first light-shielding film 90 is a 10-nm thick Cr film, the second light-shielding film 92 is a 10-nm thick MoSi film, and the third light-shielding film 94 is a 100-nm thick Cr film. The materials for the light-shielding film are not restricted to Cr and MoSi. All the three light-shielding films may be formed from different materials.

Figure 9B:
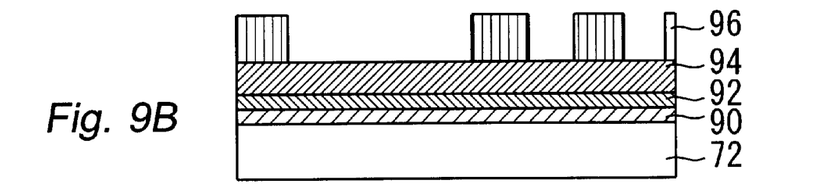

As shown in FIG. 9B, the third light-shielding film 44 is coated with a photoresist 96. The photoresist 96 is patterned by electron beams (EB) to a configuration surrounding the wiring, i.e., the configuration which accords with the light-shielding part 82 shown in FIG. 8.

Figure 9C:
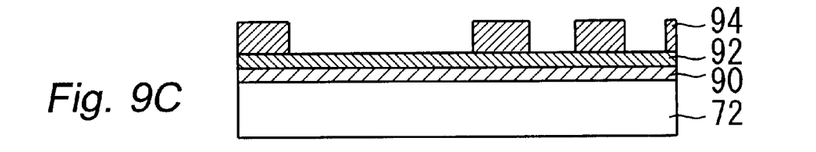

With the photoresist 96 used as a mask, etching is carried out under a condition suitable to remove the third light-shielding film 94 (e.g., Pressure of 50 mT, Gas flow rate of $Cl_2/O_2$=80/20 sccm, and Etching time of 600 sec). As a result, the third light-shielding film 94 is patterned into the shape of the light-shielding part 82 as shown in FIG. 9(c). Because of selective etching, the second light-shielding film 92 remains unetched. After patterning the third light-shielding film 94, the photoresist 96 remaining on the same is removed.

Figure 9D:
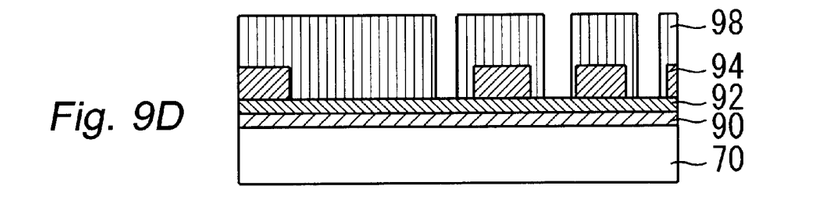

Then, the entire surface of the substrate 70 is coated with the photoresist 98. As shown in FIG. 9D, the photoresist 98 is patterned by electron beams (EB) to a configuration surrounding the deep contact plug and the shallow contact plug, i.e., a configuration surrounding the first transmittance part 76 and the second transmittance part 78 shown in FIG. 8.

Figure 9E:
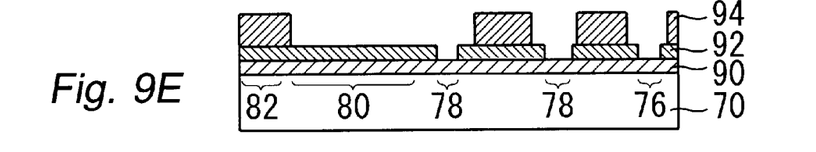

With the photoresist 96 used as a mask, etching is carried out under a condition suitable to remove the second light-shielding film 92 (i.e. Pressure of 50 mT, Gas flow rate of $CF_4/O_2/N_2$=100/5/20 sccm, and Etching time of 300 sec). As a result, the second light 7 shielding film 92 is patterned into the shape surrounding the first transmittance part 76 and the second transmittance part 78. Because of selective etching, the first light-shielding film 90 remains unetched. After patterning the second light-shielding film 92, the photoresist 98 remaining on the same is removed.

Figure 9F:
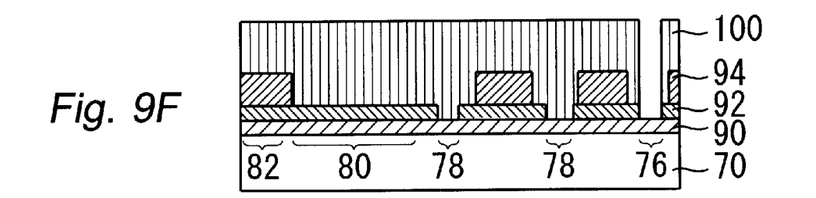

Then, the entire surface of the substrate 70 is coated again with the photoresist 100. As shown in FIG. 9F, the photoresist 100 is patterned by electron beams (EB) to a configuration surrounding the deep contact plug, i.e., a configuration surrounding the first transmittance part 76 shown in FIG. 8.

Figure 9G:
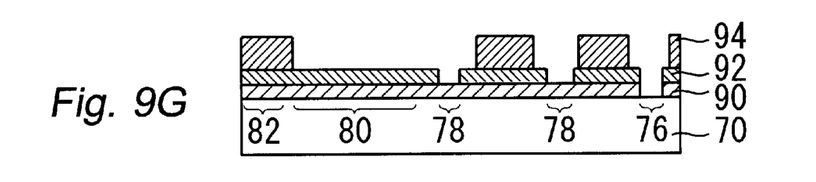

With the photoresist 100 used as a mask, etching is carried out under a condition suitable to remove the first light-shielding film 90 (i.e., Pressure of 50 mT, Gas flow rate of $Cl_2/O_2$=80/20 sccm, and Etching time of 60 sec). As a result, the first light-shielding film 90 is patterned into the shape surrounding the first transmittance part 76, as shown in FIG. 9G. After patterning the first light-shielding film 90, the photoresist 100 remaining on the same is removed. Thus, there is obtained the photolithography mask 70 comprising the first transmittance part 76, the second transmittance part 78, and the third transmittance part 80.

The above-mentioned method accurately controls the thickness of the individual light-shielding films by utilizing etching selectivity. Since the transmittance of each part of the photolithography mask 70 is determined by the thickness of the light-shielding film covering the individual parts, it is possible to accurately control the transmittances of the first to third light-shielding films to desired values when the thickness of the individual film is capable of being accurately controlled. As described, stacking and etching different light-shielding films result in easy production of a mask having a plurality of transmittances.

The method for producing a mask having three or more different transmittances is not limited to the one explained with reference to FIGS. 9A through 9G. It is possible to produce a mask having three or more different transmittances by repeating the steps of forming the light-shielding films and performing etching on them, on the basis of the method for manufacturing a photolithography mask which was explained above with reference to FIGS. 4A through 4F.

In the above-mentioned embodiments 1 to 4, a plurality of stacked photoresist films are exposed all at once through a photolithography mask having different values of transmittance. However, the method of exposure for the photoresist is not limited to this. It is also possible to expose the stacked photoresist through a plurality of masks such as shown in FIGS. 11A and 11B which are provided for individual patterns, although exposure in this manner does not produce the effect of preventing misalignment. In this case, the condition of exposure (such as wavelength and amount of exposure light) can be adjusted for the individual masks and hence it is possible to sensitize individually a plurality of photoresist films as desired.

In the above-mentioned first to fourth embodiments, the first photoresist film 36, the second photoresist film 38 and the third photoresist film 72 are limited to positive type. However, the present invention is not limited to this; that is, the first photoresist film 36, the second photoresist film 38 and the third photoresist film 72 may be negative type. In this case, the photoresist film should be arranged such that the lower layer has a lower sensitivity. In this way, it is possible to produce the same effect as in the first to fourth embodiments, or it is possible to accurately pattern the first through third photoresist films.

The present invention is constructed as mentioned above. Therefore, it produces the following effect.

According to a first aspect of the present invention, a plurality of photoresist films are stacked on a semiconductor substrate and they are irradiated with exposure light varying in intensity. Since the individual photoresist films vary in sensitivity, one layer is sensitized but another layer is not sensitized, with sensitized layers and unsensitized layers being separated at there boundary. Therefore, when the individual photoresist films are patterned into a desired shape, the difference in depth of the plurality of wiring element to be formed can be reflected accurately in the thickness direction of the plurality of photoresist films. Etching through the thus patterned plurality of photoresist films as a mask permits one to readily form a plurality of wiring elements differing in depth and pattern.

According to a second aspect of the present invention, a plurality of photoresist films are stacked in such a way that the lower layer has a lower sensitivity in the case where the photoresist is a positive type. In this case it is easy to sensitize the upper photoresist without sensitizing the lower photoresist. Therefore, it is possible to reflect the difference in depth of the plurality of wiring element easily and accurately to the photoresist. Also, a plurality of photoresist films are stacked in such away that the lower layer has a higher sensitivity in the case where the photoresist is a negative type. In this case it is easy to sensitize the lower photoresist without sensitizing the upper photoresist. Therefore, it is possible to reflect the difference in depth of the plurality of wiring element easily and accurately to the photoresist.

According to a third aspect of the present invention, a plurality of photoresist films are irradiated with exposure light all at once through a single mask having a plurality of parts differing in transmittance. Therefore, it is possible to produce a semiconductor device with a plurality of wiring elements with a less number of steps.

According to a fourth aspect of the present invention, a plurality of photoresist films are irradiated with exposure light through a plurality of photolithography masks arranged in response to the individual wiring elements. In this case, it is possible to adjust the exposure condition for each photolithography mask and hence it is possible to finely adjust the amount of exposure light corresponding to each of the plurality of photoresist films. Therefore, according to this invention, it is possible to accurately reflect the difference in depth of a plurality of wiring elements to the photoresist films.

According to a fifth aspect of the present invention, it is possible to form a space for a specific wiring element by using a stopper film. Therefore, it is possible to form the specific wiring element readily and accurately.

According to a sixth aspect of the present invention, since three or more light-shielding films are formed on the substrate, four or more kinds of transmittance are realized. The individual light-shielding films are not removed when the upper light-shielding film is etched. Accordingly, the present invention provides a photolithography mask which has four or more kinds of transmittance, with each transmittance accurately controlled.

According to a seventh aspect of the present invention, a plurality of light-shielding films are formed by alternate lamination of Cr film and MoSi film. These light-shielding films have a high resistance to etching for the individual layers. Therefore, according to the present invention, it is possible to accurately control four or more kinds of transmittance in the photolithography mask.

According to a eighth aspect of the present invention, n layers of light-shielding films are formed on the substrate and the nth light-shielding film is patterned to the shape corresponding to all the wiring elements. Subsequently, the (n−1)th light-shielding film to the first light-shielding film are formed sequentially in their respective desired shape. As a result, it is possible to readily realize the photolithography mask having four or more kinds of transmittance.

Further, the present invention is not limited to these embodiments, but variations and modifications may be made without departing from the scope of the present invention.

The entire disclosure of Japanese Patent Application No. 2000-171330 filed on Jun. 7, 2000 including specification, claims, drawings and summary are incorporated herein by reference in its entirety.

What is claimed is:

1. A method for manufacturing a semiconductor device having a plurality of wiring elements differing in depth and pattern, said method comprising the steps of:

stacking a plurality of photoresist films differing in sensitivity on a prescribed film formed on a semiconductor substrate;

exposing said plurality of photoresist films in such a way that the respective parts where said plurality of wiring elements are formed are irradiated with exposure light with an intensity corresponding to the depth of the individual wiring element;

developing said plurality of photoresist films so as to pattern the individual photoresist films into a desired shape;

etching said prescribed film by using said plurality of photoresist films, which have been patterned, as a mask, thereby forming a space to accommodate said plurality of wiring elements; and embedding a metal material in said space so as to form said plurality of wiring elements.

2. The method for manufacturing a semiconductor device according to claim 1, wherein said plurality of photoresist films are stacked such that the lower layer has a lower sensitivity in a case where the films are positive type or a higher sensitivity in a case where the films are negative type.

3. The method for manufacturing a semiconductor device according to claim 1, wherein the step of exposing said plurality of photoresist films is accomplished by using a single photolithography mask which has different transmittance corresponding to the depth of the individual wiring elements at the part corresponding to the individual wiring elements.

4. The method for manufacturing a semiconductor device according to claim 1, wherein the step of exposing said plurality of photoresist films is accomplished by using a plurality of photolithography masks arranged in response to the individual wiring elements.

5. The method for manufacturing a semiconductor device according to claim 1, wherein:

said prescribed film has an etching stopping film at the position corresponding to the bottom of at least one wiring element; and the step of etching said prescribed film includes a substep of forming a space to accommodate said one wiring element by using said stopper film and a substep of etching said stopper film and a film underneath thereof into a desired shape, thereby forming a space to accommodate a wiring element which extends to the position deeper than said one wiring element.

6. A photolithography mask used to form n kinds (n is an integer of 3 or above) of wiring elements differing in depth and pattern, said photolithography mask comprising:

a substrate which transmits the exposure light; and n layers of light-shielding films which are stacked on said substrate, each of said n layers of light-shielding films having a high resistance to etching to remove the light-shielding film placed thereon and also being patterned to a desired shape.

7. The photo lithography mask according to claim 6, wherein said n layers of light-shielding films are composed of Cr film and MoSi film stacked alternately.

8. A method for manufacturing a photolithography mask used to form n kinds (n is an integer of 3 or above) of wiring elements differing in depth and pattern, said method comprising the steps of:

stacking sequentially n layers of light-shielding films, from the first layer to the nth layer, on a substrate which transmits the exposure light; and etching said n layers of light-shielding films sequentially starting from the nth layer in such a way that the ith layer (i is an integer of 1 to n) of light-shielding film assumes a shape corresponding to all of the i kinds of the wiring elements selected from the deeper side, each of said nth layer of light-shielding film having a high resistance to etching to remove the light-shielding film placed thereon.

9. The method for manufacturing a photolithography mask according to claim 8, wherein the step of stacking sequentially said n layers of light-shielding films is accomplished by stacking Cr film and MoSi film alternately.

* * * * *